(12) United States Patent
Sugawara (10) Patent No.: US 7,319,628 B2
(45) Date of Patent: Jan. 15, 2008

(54) SEMICONDUCTOR MEMORY AND METHOD FOR MANUFACTURING THE SAME

(75) Inventor: Hiroshi Sugawara, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 81 days.

(21) Appl. No.: 11/091,523

(22) Filed: Mar. 29, 2005

(65) Prior Publication Data
US 2005/0219920 A1 Oct. 6, 2005

(30) Foreign Application Priority Data
Mar. 30, 2004 (JP) ............................. 2004-101199

(51) Int. Cl.
*G11C 7/02* (2006.01)
(52) U.S. Cl. ...................................... 365/210; 365/200
(58) Field of Classification Search ................ 365/210, 365/200
See application file for complete search history.

(56) References Cited

U.S. PATENT DOCUMENTS

| | | | |
|---|---|---|---|
| 4,817,056 A * | 3/1989 | Furutani et al. ............ 365/200 |
| 4,849,938 A * | 7/1989 | Furutani et al. ............ 365/200 |
| 6,243,306 B1 * | 6/2001 | Kirihata ...................... 365/200 |
| 2001/0048625 A1 * | 12/2001 | Patti et al. .................. 365/201 |
| 2004/0017718 A1 * | 1/2004 | Ooishi ........................ 365/210 |
| 2004/0037112 A1 * | 2/2004 | Ooishi .................. 365/185.09 |
| 2004/0165419 A1 * | 8/2004 | Tsuji ........................ 365/158 |

FOREIGN PATENT DOCUMENTS

JP      2001-184858 A      7/2001

* cited by examiner

*Primary Examiner*—Thong Q. Le
(74) *Attorney, Agent, or Firm*—Sughrue Mion, PLLC

(57) ABSTRACT

A semiconductor memory includes a plurality of memory portions; and a plurality of spare memory portions. The memory portion includes: a main cell array which includes memory cells, a first reference cell which stores a first reference data in a nonvolatile state, and a first sense amplifier which reads a first state of the memory cell based on the first state and a second state of the first reference cell. The memory cell stores data in a nonvolatile state. The spare memory portion includes: a spare cell array which includes spare cells as spares of the memory cells, a second reference cell which stores a second reference data in a nonvolatile state, and a second sense amplifier which reads a third state of the spare cell based on the third state and a fourth state of the second reference cell. The memory portion having a defect on the first reference cell is replaced with the spare memory portion.

9 Claims, 6 Drawing Sheets

SEMICONDUCTOR MEMORY AND METHOD FOR MANUFACTURING THE SAME

BACKGROUND OF THE INVENTION

1. Field of the Invention

The present invention relates to a semiconductor memory and a method for manufacturing the same. More particularly, the present invention relates to a semiconductor memory whose yield is improved and a method for manufacturing the same.

2. Description of the Related Art

A nonvolatile memory (a flash memory) is known which has a nonvolatile characteristic that once stored information data is not deleted even if power supply is turned off unless deletion or write is performed. In the reading operation, the nonvolatile memory reads data by applying predetermined voltages to terminals of a memory cell and a reference cell and comparing an output of the memory cell with that of the reference cell by a sense amplifier.

Figure 1:
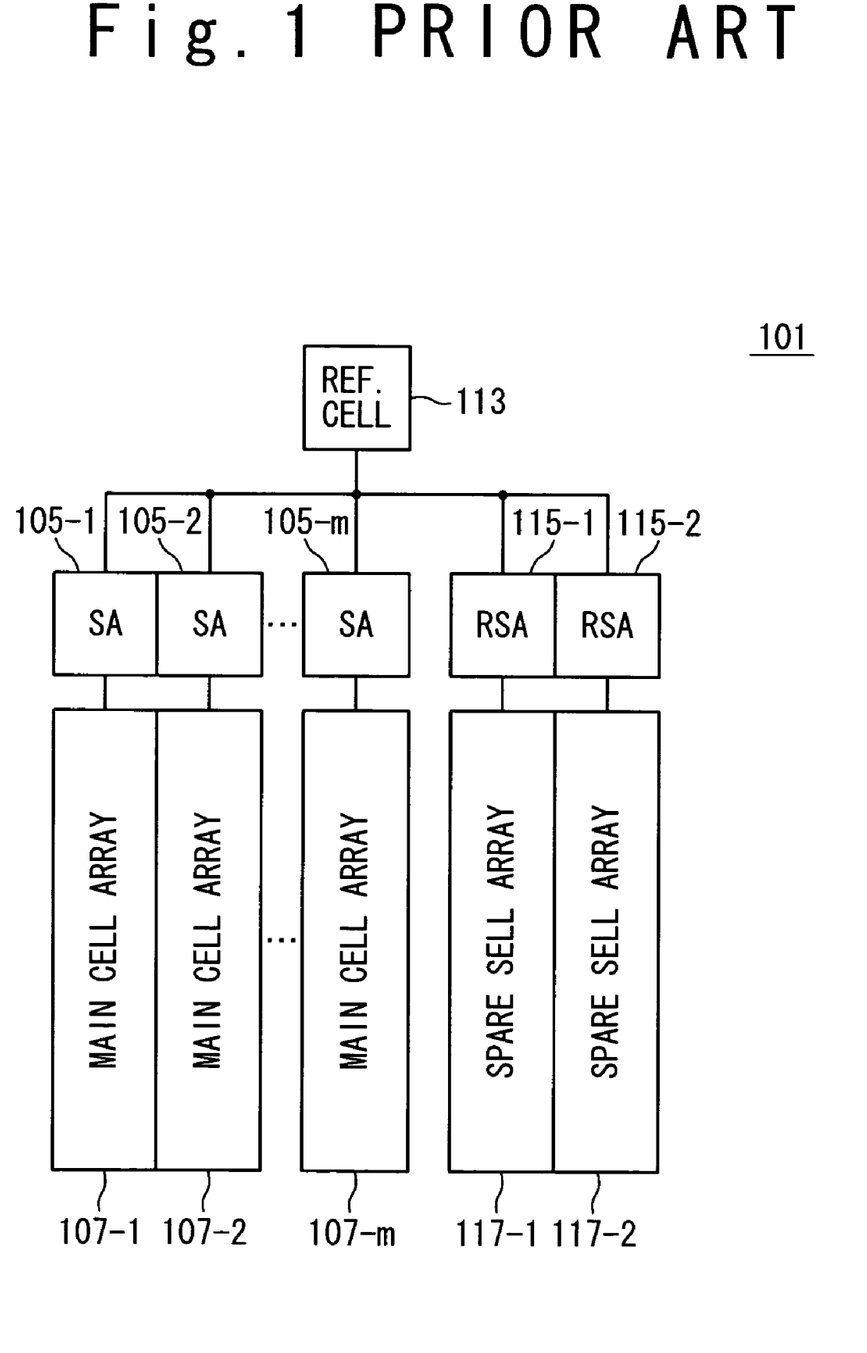
FIG. 1 is a schematic view showing a configuration of a conventional nonvolatile memory.

FIG. 1 is a schematic view showing a configuration of a conventional nonvolatile memory. The nonvolatile memory 101 includes a plurality of main cell arrays 107-1 to 107-$m$ (m is an integer of 2 or more), a plurality of sense amplifiers 105-1 to 105-$m$, a plurality of spare sell arrays 117-1 to 117-2, a plurality of spare sense amplifiers 115-1 to 115-2, and a reference cell 113. Other conventionally-known configurations not directly related to the present invention are omitted in this figure. Hereafter, when differentiation is not necessary, the numeral suffix portion (-numeral) among symbols in the configurations, such as "-1" and "-m", is omitted.

Each of the main cell arrays 107-1 to 107-$m$ includes a plurality of memory cells for storing data in a nonvolatile state. For example, each main cell array includes a plurality of bit lines and a plurality of flash memories placed along each of the bit lines. Each of the sense amplifiers 105-1 to 105-$m$ is provided correspondingly to each of the main cell arrays 107-1 to 107-$m$.

Each of the spare cell arrays 117-1 to 117-2 is provided as a spare of the main cell arrays 107-1 to 107-$m$, and includes a plurality of spare cells prepared as spares of the memory cells. Each of the spare amplifiers 115-1 to 115-2 is provided correspondingly to each of the spare cell arrays 117-1 to 117-2.

The reference cell 113 is provided as common use for the main cell array 107 and a spare cell array 117, and stores a reference data in a nonvolatile state. The data is used as reference for the reading operation of the data for the main cell or the spare cell.

In the case of the inspection in manufacturing steps, when a defect occurs in one of the memory cells in the main cell array 107, the main cell array 107 is recognized as a defective product. Then, the main cell array 107 is replaced with a spare cell array 117. In this case, a set of the main cell array 107 and the sense amplifier 105 are replaced with a set of s spare cell array 117 and a spare sense amplifier 115. Even if a defect occurs in the main cell array 107, it is not necessary to reject the whole semiconductor memory.

When the number of output bits is small, the number of the sense amplifiers 105 is the same as that of the output bits for the reading operation. In this case, a flash memory cell similar to a memory cell is used as the reference cell 113 for generating a reference data. The reference data is used for sensing the data in a memory cell. The reference cell 113 is connected to each sense amplifier 105 and shared by the main cell arrays 107.

However, when a high-speed reading operation is necessary, such as a page-read operation and a burst-read operation, it is necessary to previously read the cell data necessary for a data transfer time. Therefore, it is necessary to increase the number of the sense amplifiers 105. That is, the number of the memory cells in main cell arrays 107 is decreased to relate the increased sense amplifiers 105 to these main cell arrays 107. In this case, it is necessary to increase the number of the reference cells 113 correspondingly to the number of the sense amplifiers 105 in order to correspond to high-speed reading operation.

Figure 2:
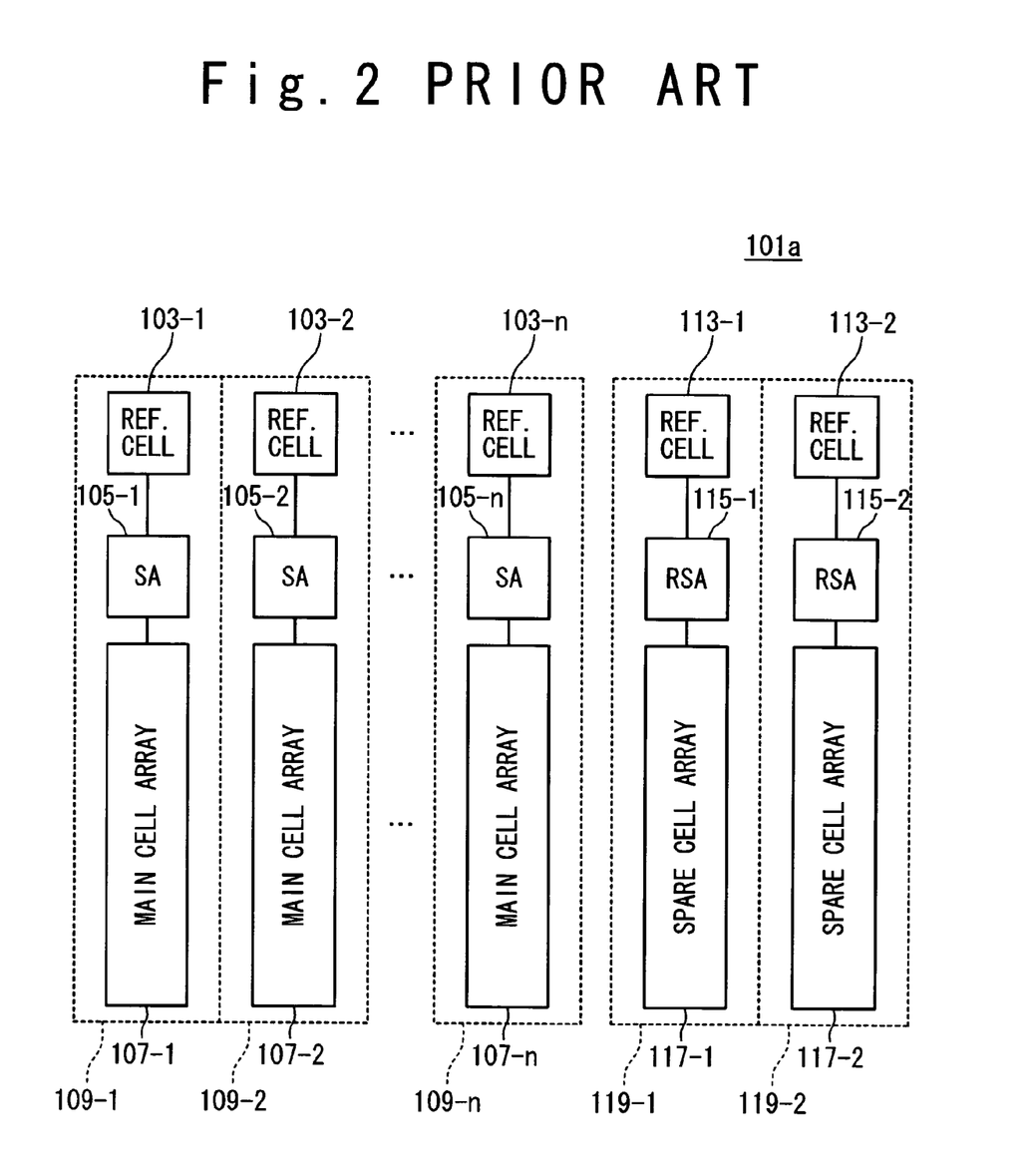
FIG. 2 is a schematic view showing another configuration of a conventional nonvolatile memory.

FIG. 2 is a schematic view showing another configuration of a conventional nonvolatile memory. The nonvolatile memory 101$a$ includes a plurality of main cell arrays 107-1 to 107-$n$ (n is integer of 2 or more; n>m), a plurality of sense amplifiers 105-1 to 105-$n$, a plurality of reference cells 103-1 to 103-$n$, a plurality of spare cell arrays 117-1 to 117-2, a plurality of space sense amplifiers 115-1 to 115-2, and a plurality of reference cells 113-1 to 113-2. Other conventionally-known configurations not directly related to a reference cell of the present invention are omitted.

Each of the plurality of the reference cells 103-1 to 103-$n$ is provided correspondingly to each of the plurality of the sense amplifiers 105-1 to 105-$n$. Each of the plurality of the reference cells 113-1 to 113-2 is provided correspondingly to each of the plurality of the spare sense amplifier 115-1 to 115-2. Other configurations are the same as those in FIG. 1.

In FIG. 2, the number of the memory cells of the one main cell array 107 decreases and the number of the main cell arrays 107 increases. That is, the number of the memory cells corresponding to one sense amplifier 105 decreases. Moreover, the reference cells (103 and 113) are provided correspondingly to the cell arrays (107 and 117). By using this configuration, it is possible to treat the high-speed reading operation.

Figure 3:
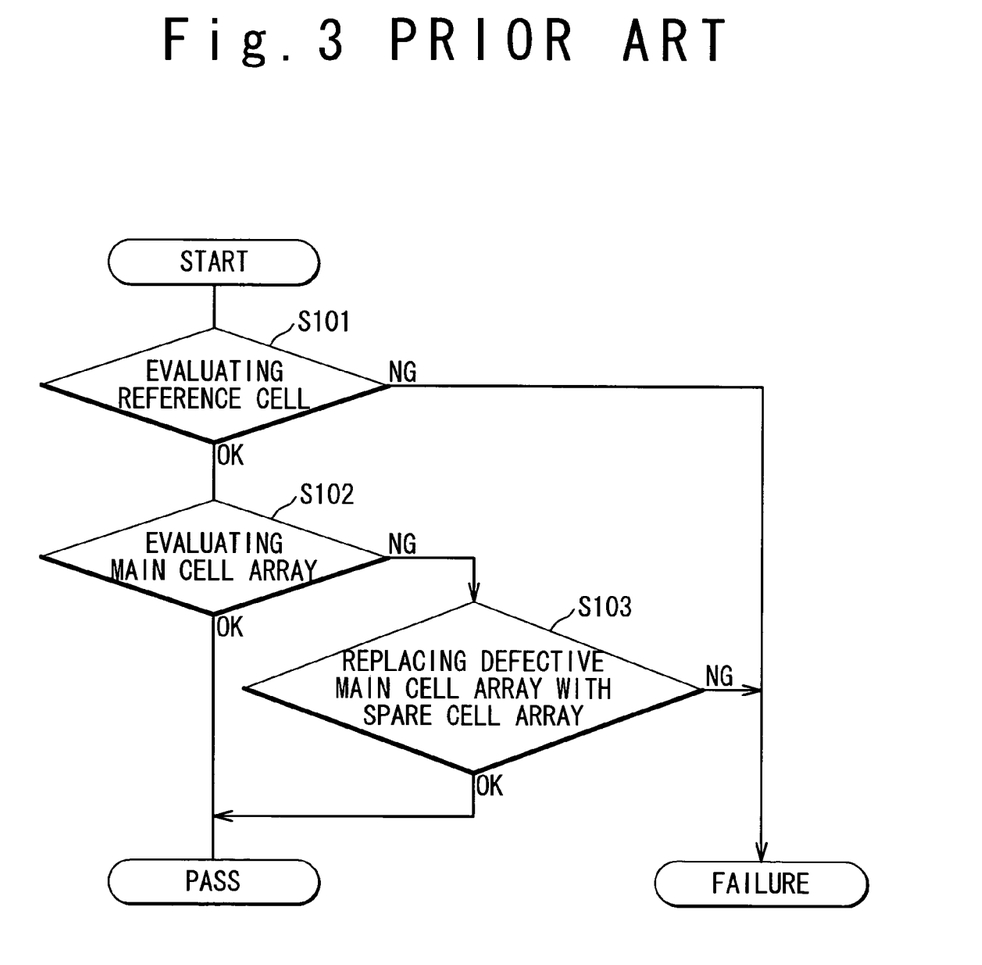
FIG. 3 is a flowchart showing the outline of inspection and replacement method in manufacturing steps of a conventional nonvolatile memory.

FIG. 3 is a flowchart showing the outline of inspection and replacement method in manufacturing steps of a conventional nonvolatile memory.

In the step S101, the reference cell 103 is evaluated. The evaluation is performed based on whether the nonvolatile memory succeeds in a predetermined writing, reading, and erasing operations of the reference cell 103. As a result of the evaluation, when the reference cell 103 has no problem (the step S101: OK), the step S102 is started. In the step S102, the evaluation is applied to all main cell arrays 107. Here, in each main cell array 107, all memory cells in the main cell array 107 are evaluated. The evaluation is performed based on whether the memory cell succeeds in a predetermined writing, reading, and erasing operation. As a result of the evaluation, when all memory cells in all main cell arrays 107 have no problem (the step S102: OK), the nonvolatile memory passes the inspection. When a defect occurs in one of the memory cells in the main cell array 107, that main cell array 107 is rejected (the step S102: NG). In this case, in the step S103, the defective main cell array 107 is replaced with the spare cell array 117 and the nonvolatile memory passes the inspection.

However, when the reference cell 103 has a problem in the step S101 (the step S101: NG), the inspection result is "failure" and the nonvolatile memory cannot be used because it is defective. That is, the yield of the manufacturing the nonvolatile memory becomes low. In this case, when the reference cells are defective, it can be estimated that main cells, of which the number is larger than that of the reference cells, are defective according to a probability theory. Therefore, when the reference cell has a defect in the process described in FIG. 3, it is not a problem to determine that the nonvolatile memory itself also has a defect.

However, in the case of the nonvolatile memory 101a in FIG. 2, because many reference cells 103 are used, the defective reference cells 103 do not always correspond to defective main cells in the main cell array 107. Particularly, in recent years, the number of sense amplifiers increases in a nonvolatile memory because of applying a multivalued cell in which a plurality of data are written in. The number of reference cells is further increased in accordance with increase of the number of sense amplifiers. Therefore, having defects on reference cells does not always mean having defects on main cells in a main cell array. Under the above condition, regarding a defective reference cell as a defective nonvolatile memory extremely lowers the yield of nonvolatile memories. A technique is desired which restrains lowering of the yield of nonvolatile memories due to defective reference cells.

In conjunction with the above description, Japanese Laid Open Patent Application JP 2001-184858 A discloses the following an integrated memory. The integrated memory has memory cells, reference cells, redundancy memory cells, and an activation unit which can be programmed. The memory cells are provided to the intersections between word lines and bit lines. The reference cell is provided to the intersection between at least one reference word line and a bit line, which is used to form a reference potential on the bit line before accessing one of memory cells. The redundancy memory cell is provided to the intersection between a redundancy word line and the bit line. The redundancy word line and the redundancy memory cell connected to the redundancy word line are replaced with the word line and the memory cell connected to the work line or replaced with the reference word line and the reference cell connected to the work line, based on the program status of the activation unit.

SUMMARY OF THE INVENTION

Therefore, an object of the present invention is to provide a semiconductor memory which can restrain lowering of the yield of semiconductor memories due to defective reference cells and a method for manufacturing the same.

Another object of the present invention is to provide a semiconductor memory which can restrain lowering of the yield of semiconductor memories due to defective reference cells while minimizing additional configurations and a method for manufacturing the same.

In order to achieve an aspect of the present invention, the present invention provides a semiconductor memory comprising: a plurality of memory portions; and a plurality of spare memory portions, wherein each of said plurality of memory portions includes: a main cell array which includes a plurality of memory cells, each of said plurality of memory cells stores data in a nonvolatile state, a first reference cell which stores a first reference data in a nonvolatile state, and a first sense amplifier which reads a first state of said each of the plurality of memory cells, based on said first state and a second state of said first reference cell, each of said plurality of spare memory portions includes: a spare cell array which is provided as a spare of said main cell array, and includes a plurality of spare cells as spares of said plurality of memory cells, a second reference cell which stores a second reference data in a nonvolatile state, and a second sense amplifier which reads a third state of said each of the plurality of spare cells, based on said third state and a fourth state of said second reference cell, one of said plurality of memory portions is replaced with one of said plurality of spare memory portions, said one of said plurality of memory portions is a defective memory portion which has a defect on said first reference cell.

In the present invention, when the reference cell is defective, the memory portion including the defective reference cell is replaced with the spare memory portion. Therefore, it is possible to restrain lowering of the yield of the semiconductor memory.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Embodiments of a semiconductor memory and a method for manufacturing a semiconductor memory of the present invention will be described below with referring to the attached drawings.

Figure 4:
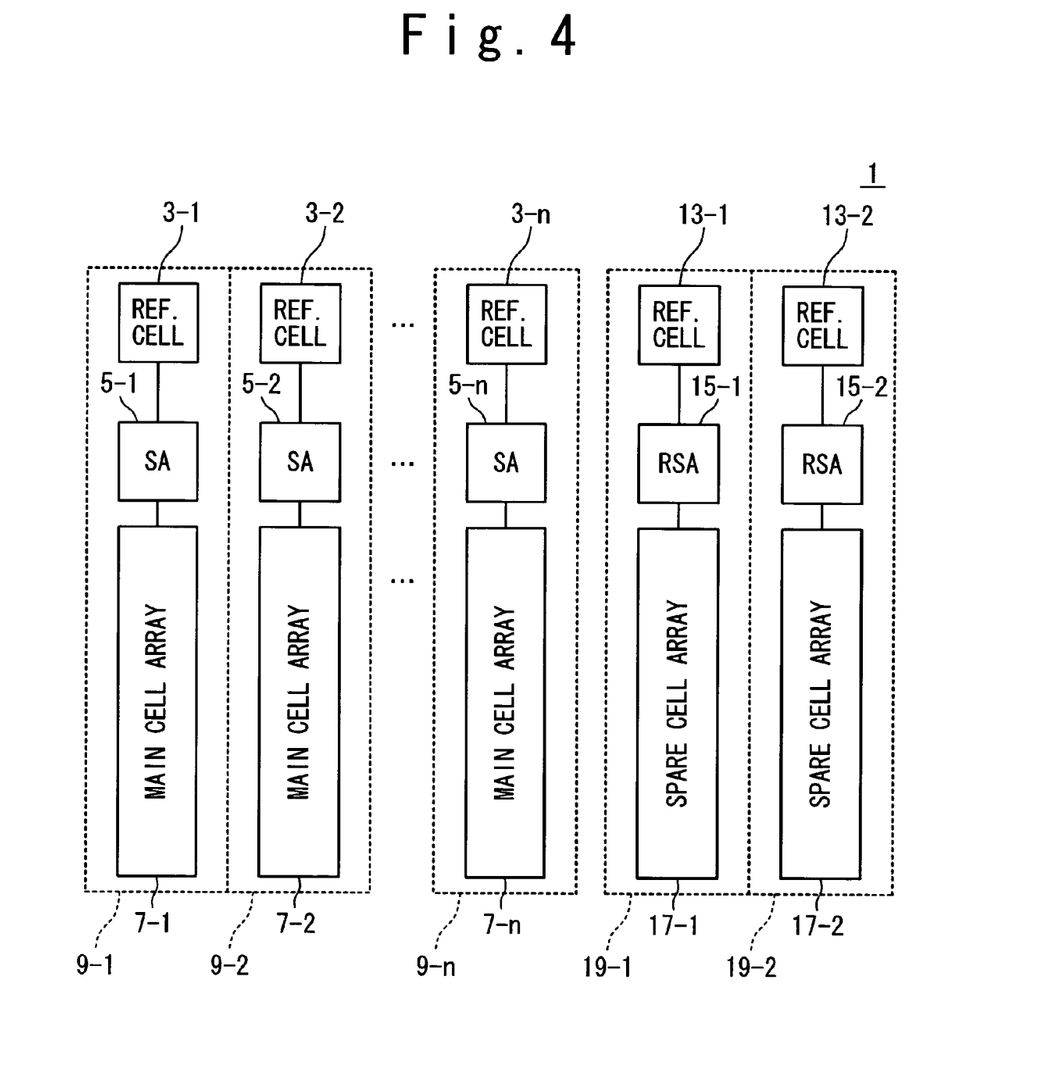
FIG. 4 is a schematic view showing a configuration of the embodiment of the semiconductor memory of the present invention.

Firstly, a configuration of the embodiment of the semiconductor memory of the present invention will be described below. FIG. 4 is a schematic view showing a configuration of the embodiment of the semiconductor memory of the present invention. A nonvolatile memory 1 as a semiconductor memory includes a plurality of main cell arrays 7-1 to 7-n (n is an integer of 2 or more; the same is applied hereinafter), a plurality of sense amplifiers 5-1 to 5-n, a plurality of reference cells 3-1 to 3-n, a plurality of spare cell arrays 17-1 to 17-2, a plurality of spare sense amplifiers 15-1 to 15-2, and a plurality of reference cells 13-1 to 13-2. Other conventionally-known configurations not directly related to the present invention are omitted in this figure.

Each of the plurality of the main cell arrays 7-1 to 7-n includes a plurality of memory cells, each of which stores data in a nonvolatile state. For example, each of the plurality of the main cell arrays 7-1 to 7-n includes a plurality of bit lines, a plurality of word lines, and a plurality of flash memories as the memory cells. Each of the plurality of sense amplifiers 5-1 to 5-n is provided correspondingly to each of the plurality of the main cell arrays 7-1 to 7-n. Each of the plurality of the reference cells 3-1 to 3-n is provided correspondingly to each of the plurality of sense amplifiers 5-1 to 5-n. Each of the plurality of the reference cells 3-1 to 3-$n$ stores reference data in a volatile state. The reference data is used as a reference when reading data from the memory cell. For example, a flash memory is used as each of the plurality of the reference cells 3-1 to 3-$n$. Hereafter, when differentiation is not necessary, the numeral suffix portion (-numeral) among symbols in the configurations, such as "1-1" and "-m", is omitted.

The plurality of the spare cell arrays (redundancy cell arrays) 17-1 to 17-2 are provided as spares of main cell arrays 7-1 to 7-$n$. The plurality of the spare cell arrays 17-1 to 17-2 have a plurality of spare cells as spares of the plurality of the memory cells. For example, a plurality of bit lines, a plurality of word lines, and a plurality of spare flash memories (redundancy cells) are included. Each of the plurality of the spare sense amplifiers 15-1 to 15-2 is provided correspondingly to each of the plurality of the spare cell arrays 17-1 to 17-2. Each of the plurality of the reference cells 13-1 to 13-2 is provided correspondingly to each of the plurality of the spare sense amplifiers 15-1 to 15-2. Each of the plurality of the reference cells 13-1 to 13-2 stores a reference data in a nonvolatile state. The reference data is used as a reference when reading the data for the spare cell. For example, a flash memory is used as each of the plurality of the reference cells 13-1 to 13-2.

In this case, the reference cell 3, the sense amplifier 5, and the main cell array 7 constitute a set of memory portion 9. Similarly, the reference cell 13, the spare sense amplifier 15, and the spare cell array 17 constitute a set of spare memory portion 19. That is, the nonvolatile memory 1 includes a plurality of memory portions 9-1 to 9-$n$ and a plurality of spare memory portions 19-1 to 19-2. Here, the number of spare memory portions 19 is not restricted to 2.

In the present invention, in inspections of manufacturing steps, when there is a defective main cell array 7, the memory portion 9 including the defective main cell array 7 is replaced with the spare memory portion 19. In addition, when there is a defective reference cell 3, the memory portion 9 including the defective reference cell 3 is replaced with the spare memory portion 19. Thereby, even if the defective reference cell 3 is found, it is not necessary to treat the whole nonvolatile memory (semiconductor memory) as a defective product. That is, it is possible to restrain lowering of the yield of nonvolatile memories (semiconductor memories) due to defective reference cells.

Figure 5:
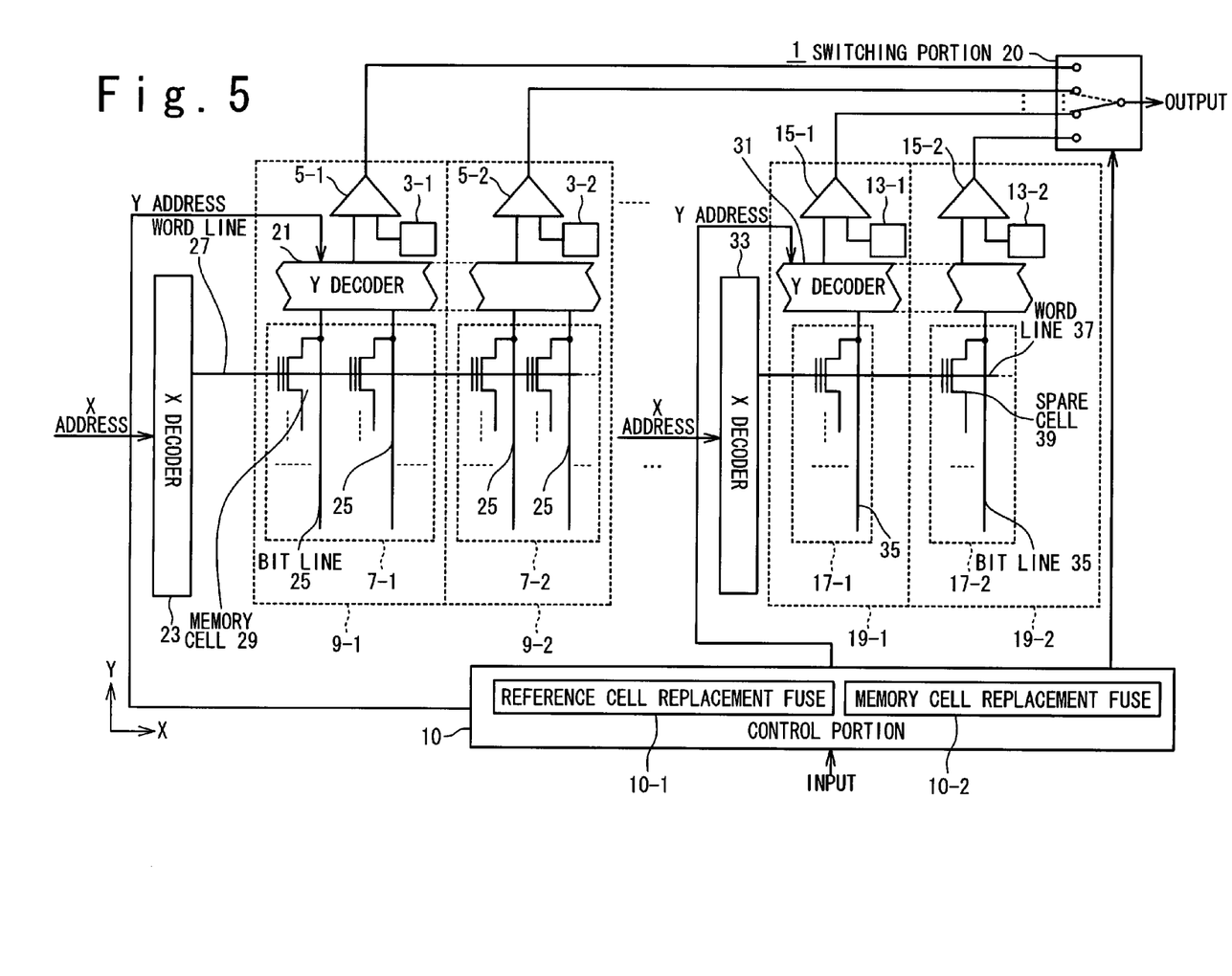
FIG. 5 is a block diagram showing a configuration of the embodiment of the semiconductor memory of the present invention.

The detail of the configuration in FIG. 4 is described below with reference to FIG. 5. FIG. 5 is a block diagram showing a configuration of the embodiment of the semiconductor memory of the present invention. The nonvolatile memory 1 as the semiconductor memory includes the plurality of the memory portions 9-1 to 9-$n$ (in FIG. 5, up to 9-2 is shown), a Y decoder 21, an X decoder 23, the plurality of the spare memory portions 19-1 to 19-2, a Y decoder 31, an X decoder 33, a control portion 10, and a switching portion 20. Other conventionally-known configurations not directly related with the present invention are omitted in this figure.

The plurality of memory portions 9 includes the main cell array 7, the (first) sense amplifier 5, and the (first) reference cell 3 as described above. The main cell array 7 includes a plurality of bit lines 25, a plurality of word lines 27, and a plurality of memory cells 29.

Each of the plurality of the bit lines 25 is extended to Y direction and connected to the Y decoder 21. Each of the plurality of the word lines 27 is extended to X direction and connected to the X decoder 23. The plurality of memory cells 29 is provided correspondingly to each of intersections between the plurality of the bit lines 25 and the plurality of the work lines 27. The memory cell 29 stores data in a nonvolatile state and is exemplified as a flash memory.

The X decoder 23 selects a selective word line 27$s$ from the plurality of the word lines 27 in response to an input of the control signal (a X address signal). At the X decoder 23 side, the configuration like the control portion 10 is omitted and the same signal is inputted to the X decoder 23 and the X decoder 33. However, it may use a configuration like the control portion 10 for the X decoder 23 and the X decoder 33. The Y decoder 21 selects a selective bit line 25$s$ from the plurality of the bit lines 25 in response to an input of a control signal (a Y address signal). Here, one X decoder and one Y decoder are shown in FIG. 5. However, the X decoder 23 and Y decoder 21 may respectively have a hierarchical structure (ex. a global decoder and a local decoder).

The spare memory portion 19 includes the spare cell array 17, the spare (second) sense amplifier 15, and the (second or third) reference cell 13 as described above. The spare cell array 17 includes a plurality of bit lines 35, a plurality of word lines 37, and a plurality of spare cells 39.

Each of the plurality of the bit lines 35 is extended to Y direction and connected to the Y decoder 31. Each of the plurality of word lines 37 is extended to X direction and connected to the X decoder 33. Each of the plurality of the spare cells 39 is provided correspondingly to each of intersections between the plurality of the bit lines 35 and the plurality of the word lines 37. The spare cell 39 stores data in a nonvolatile state and is exemplified as a flash memory.

The X decoder 33 selects a selective word line 37$s$ from the plurality of the word lines 37 in response to an input of a control signal (X address). At the X decoder 33 side, a configuration like the control portion 10 is omitted and the same signal is inputted to the X decoder 23 and the X decoder 33. However, it may use a configuration like the control portion 10. The Y decoder 31 selects a selective bit line 35$s$ from the plurality of the bit lines 35 in response to an input of a control signal (Y address signal). Here, one X decoder and one Y decoder are shown in FIG. 5. However, the X decoder 33 and the Y decoder 31 may respectively have a hierarchical structure (ex. a global decoder and a local decoder).

The control portion 10 outputs a control signal (a Y address signal) to either of the Y decoder 21 and the Y decoder 31 in response to a predetermined input signal (including the Y address signal) and states of a reference cell replacement fuse (a replacement portion or a second control portion) 10-1 and a memory cell replacement fuse (a replacement portion or a first control portion) 10-2. Here, the control portion 10 may output the control signals to the Y decoders 21 and 31 at the same time. Moreover, the control portion 10 outputs a switching signal to the switching portion 20. The switching signal shows that which of the plurality of the memory portions 9 (the sense amplifiers 5) and the plurality of the spare memory portions 19 (the spare sense amplifiers 15) outputs an output signal to the switching portion 20 in response to the predetermined input signal (including Y address signal) and the states of the reference replacement fuse 10-1 and the memory cell replacement fuse 10-2.

When the nonvolatile memory 1 is inspected and there is a defect in the memory cell of the main cell array 7, the control portion 10 programs a first address in the predetermined memory cell replacement fuse 10-2 to replace the memory portion 9 including the defective main cell array 7 with the spare memory portion 19. The first address is an address of either of the memory portion 9 including the defective memory cell and the main cell array 7 including the defective memory cell.

Moreover, when there is a defect in the reference cell 3, the control portion 10 programs a second address in the reference cell replacement fuse 10-1 to replace the memory portion 9 including the defective reference cell 3 with the spare memory portion 19. The second address is an address of either of the main cell array 7 corresponding to the defective reference cell 3 and the memory portion 9 including the defective reference cell 3.

Moreover, when there is a defect in the reference cell 13, the control portion 10 programs a third address in the reference cell replacement fuse 10-1 to replace the spare memory portion 19 including the defective spare reference cell 13 with another spare memory portion 19. The third address is an address of either of the spare cell array 17 corresponding to the defective reference cell 13 and the spare memory portion 19 including the defective reference cell 13.

The reference cell replacement fuse 10-1 and the memory cell replacement fuse 10-2 are exemplified as an antifuse and a metal fuse. By programming the address of the memory portion 9 or the like, it is possible that any spare memory portion 19 or the like is replaced with the memory portion 9 or the like. The reference cell replacement fuse 10-1 and the memory cell replacement fuse 10-2 respectively include a plurality of replacement fuses.

When the nonvolatile memory 1 normally operates and the control portion 10 receives the Y-address signal showing (the memory cell 29 of) the normal main cell array 7, the control portion 10 outputs the control signal (including the Y-address signal) to the Y decoder 21. The control portion 10 may output the control signal to the Y decoder 31 at the same time. Moreover, the control portion 10 outputs the switching signal showing which of the plurality of the memory portions 9 (the sense amplifiers 5) outputs the output signal to the switching portion 20.

When the control portion 10 receives the Y-address signal showing (the memory call 29 of) the main cell array 7 of the memory portion 9 including a defective reference cell 3, the control portion 10 outputs the control signal (including the Y-address signal) to the Y decoder 31. At the same time, the control portion 10 may output the control signal to the Y decoder 21. Moreover, the control portion 10 outputs the switching signal showing which of the plurality of the spare memory portions 19 (the spare sense amplifier 15) outputs the output signal to the switching portion 20. This operation is performed when the address programmed in the reference cell replacement fuse 10-1 coincides with a received address signal.

When the control portion 10 receives the address signal showing (the memory cell 29 of) the defective main cell array 7, the control portion 10 outputs the control signal (including the Y-address signal) to the Y decoder 31. At the same time, the control portion 10 may output the control signal to the Y decoder 21. Moreover, the control portion 10 outputs the switching signal showing which of the plurality of the spare memory portion 19 (spare sense amplifier 15) outputs the output signal to the switching portion 20. This operation is performed when the address programmed in the memory-cell replacement fuse 10-2 coincides with a received address signal.

The same mechanism can be built in the X decoder side. However, the details are omitted in this embodiment.

The switching portion 20 switches a switch to a wiring to be connected to one of the plurality of the sense amplifiers 5 and the plurality of the spare sense amplifiers 15, which outputs the output signal, in response to the switching signal from the control portion 10.

Figure 6:
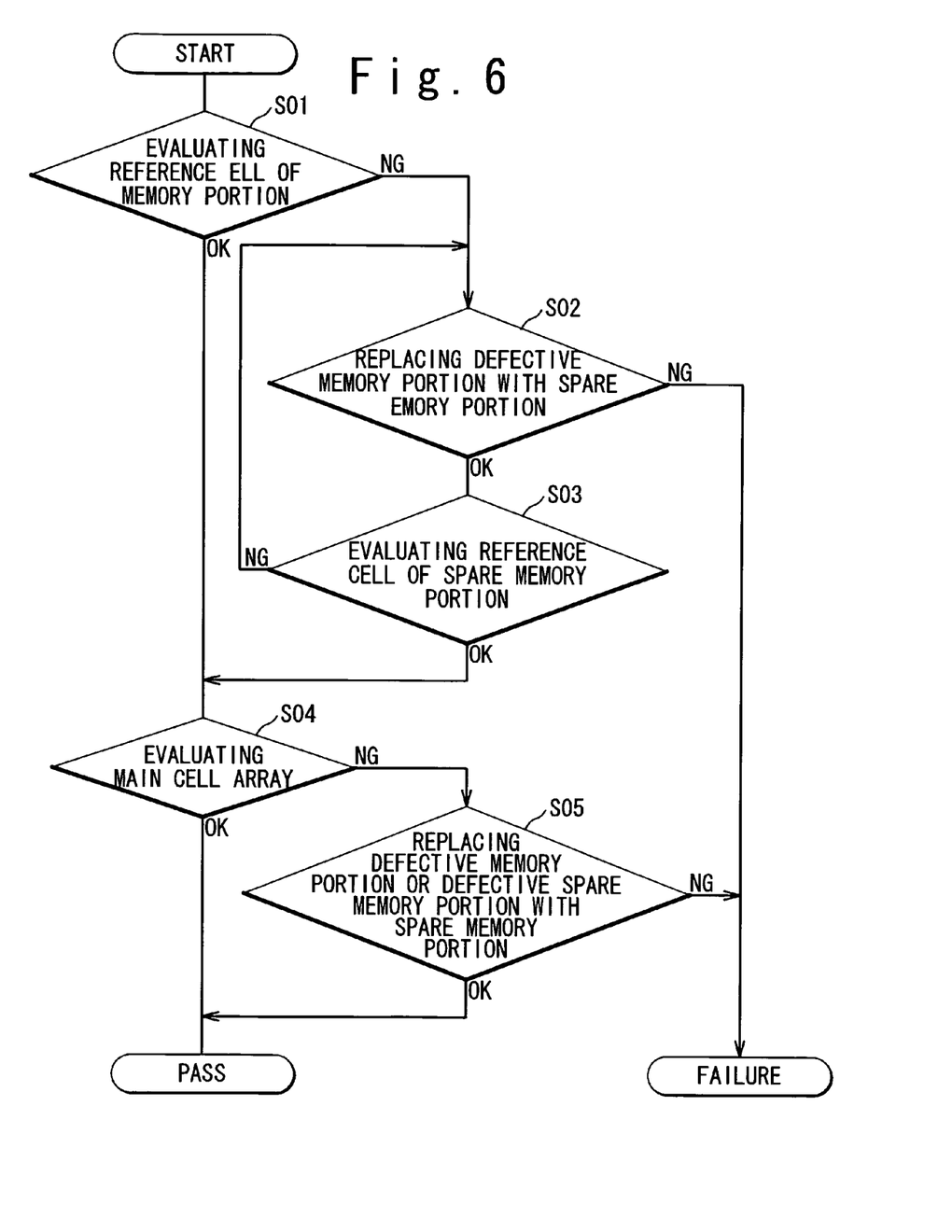
FIG. 6 is a flow chart showing the inspection and replacement method of the memory portion in the embodiment of the method for manufacturing the semiconductor memory of the present invention.

Then, the embodiment of the method for manufacturing the semiconductor memory of the present invention will be described below with reference to an attached drawing. FIG. 6 is a flow chart showing the inspection and replacement method of the memory portion in the embodiment of the method for manufacturing the semiconductor memory of the present invention. The flow in FIG. 6 is applied to each memory portion 9.

(1) Step S01

In the memory portion 9, the reference cell 3 is evaluated. The evaluation is performed based on whether the semiconductor memory succeeds in predetermined writing, reading, and erasing operations of the reference cell 3. As a result of the evaluation, when the reference cell 3 has no problem (the step S01: OK), the step S04 is started. It is possible to use a conventionally-known method as the evaluation method.

(2) Step S02

When there is a defect on the reference cell 3 (the step S01: NG), the defective memory portion 9 is replaced with an unused spare memory portion 19 among the plurality of the spare memory portions 19-1 to 19-2. For the address of the main memory cell 7 (, or the memory cell 29, or the memory portion 9) included in the defective memory portion 9, the reference-cell replacement fuse 10-1 is programmed so as to select the spare cell array 17 (, or the spare cell 39, or the spare memory portion 19) included in the replaced spare memory portion 19. Thereby, the defective memory portion 9 is replaced with one spare memory portion 19 (the step S02: OK). Thereafter, the step S03 is started. However, when all spare memory portions 19 to be replaced are already used (the step S02: NG), the result of the inspection is a "failure".

Similarly, when there is a defect on the reference cell 13 (the step S03: NG), the defective memory portion 9 is replaced with an unused spare memory portion 19 among the plurality of the spare memory portions 19-1 to 19-2. That is, for the address of the main cell array 7 (, or memory cell 29, or memory portion 9) included in the defective memory portion 9, the reference-cell replacement fuse 10-1 is programmed so as to select the spare cell array 17 (, or the spare cell 39, or the spare memory portion 19) included in the replaced spare memory portion 19. Thereby, the defective memory portion 9 is replaced with another spare memory portion 19 (the step S02: OK). Thereafter, the step S03 is started. However, when all spare memory portions 19 to be replaced are already used (the step S02: NG), the result of the inspection is a "failure".

(3) Step S03

In the case that the spare memory portion 19 substitutes for the defective memory portion 9, the reference cell 13 is evaluated. The evaluation is performed based on whether the semiconductor memory succeeds in predetermined writing, reading, and erasing operations of the reference cell 13. As a result of the evaluation, when the reference cell 13 has no problem (the step S03: OK), the step S04 is started. On the other hand, when the reference cell 13 has a problem, the step S02 is started as described above. It is possible to use a conventionally-known method as the evaluation method.

(4) Step S04

In the main cell array 7, all memory cells 29 are evaluated. The evaluation is performed based on whether the semiconductor memory succeeds in predetermined writing, reading, and erasing operations of each of the memory cells 29. As a result of the evaluation, when the main cell array 7 has no problem (the step S04: OK), the result of the inspection is a "pass". It is possible to use a conventionally-known method as the evaluation method.

(5) Step S05

When there is a defect on the main cell 29 of the main cell array 7 (the step S04: NG), a defective memory portion 9 is replaced with an unused memory portion 19 among the plurality of the spare memory portions 19-1 to 19-2. That is, for the address of the main cell array 7 (, or the memory cell 29, or the memory portion 9) included in the defective memory portion 9, the memory-cell replacement fuse 10-2 is programmed so as to select the spare cell array 17 (, or the spare cell 39, or the spare memory portion 19) included in the replaced spare memory portion 19. Thereby, the defective memory portion 9 is replaced with one spare memory portion 19 (the step S05: OK), the result of the inspection is a "pass". However, when all spare memory portions 19 to be replaced are already used (the step S04: NG), the result of the inspection is a "failure".

Thereafter, all memory cells 29 of the replaced spare memory portion 19 may be evaluate in the step S04 after the step S05.

As described above, the inspection and replacement method of the memory portion is performed in the method for manufacturing the semiconductor memory of the present invention.

The detail operation for selecting the replaced spare cell 39 is performed as described below in the writing, reading, and erasing operations in the nonvolatile memory 1. Here, the case is shown, in which the memory portion 9-1 has been replaced with the spare memory portion 19-1 because the portion 9-1 is defective.

That is, the control unit (not shown) including the control portion 10 receives an address signal showing the memory cell 29 of the memory portion 9 including the defective reference cell 3. Or, the control unit (not shown) including the control portion 10 receives an address signal showing the main cell 29 of the main cell array 7 including the defective memory cell 29. Then, the control portion 10 outputs a control signal (including the Y address signal) to the Y decoder 31 correspondingly to the programmed state of the replacement fuse (10-1 or 10-2). At the same time, the control portion 10 may output the control signal to the Y decoder 21. Also, the control unit outputs another control signal (including the X address signal) to the X decoder 33. At the same time, the control unit may output the other control signal to the X decoder 23. The Y decoder 31 selects the selective bit line 35s in response to the control signal, and the X decoder 33 selects the selective word line 37s in response to the other control signal. Then, the spare cell 39 of the spare cell array 17-1 of the replaced spare memory portion 19-1, indicated in the address corresponding to the control signal and the other control signal, is selected.

In the reading operation, the control unit (not shown) including the control portion 10 outputs a switching signal to the switching portion 20. The switching signal indicates that the replaced spare memory portion 19-1 (sense amplifier 15-1) outputs an output signal. The spare sense amplifier 15-1 compares an output of the selected spare cell 39 with that of the reference cell 13-1 corresponding to the selected spare cell 39. Then, the spare sense amplifier 15-1 outputs the comparison result to the switching portion 20. In this case, the switching portion 20 selects and outputs the output signal of the spare sense amplifier 15-1 in response to the switching signal supplied from the control portion 10.

The writing and erasing operations are the same as the conventional technique except that the operation of selecting the spare cell 39.

In the writing, reading, and erasing operations of the nonvolatile memory 1, the operation for selecting the normal memory cell 29 is performed as described below. In this case, the case of selecting the memory cell 29 of the memory portion 9-1 is described below.

That is, the control unit (not shown) including the control portion 10 receives an address signal showing the memory cell 29 of the normal main cell array 7. Then, the control portion 10 outputs a control signal (including the Y address signal) to Y decoder 21. At the same time, the control portion 10 may output the control signal to the Y decoder 31. Also, the control unit another control signal (including the X address signal) to the X decoder 23. At the same time, the control unit may output the control signal to the X decoder 33. The Y decoder 21 selects a selective bit line 25s in response to the control signal. The X decoder 23 selects a selective word line 27s in response to the other control signal. Then, the memory cell 29 of the main cell array 7-1, indicated in the address corresponding to the control signal and the other control signal, is selected.

In the reading operation, the control portion 10 outputs a switching signal showing that the memory portion 9-1 (sense amplifier 5-1) outputs an output signal together with the output of the control signal. The sense amplifier 5-1 compares the output of the selected memory cell 29 with that of reference cell 3-1 corresponding to the selected memory cell 29. Then, the sense amplifier 5-1 outputs the comparison result to the switching portion 20. In this case, the switching portion 20 selects and outputs an output of the sense amplifier 5-1 in response to the switching signal supplied from the control portion 10.

The writing and the erasing operations are also the same as the conventional technique.

The present invention makes it possible to change the memory portion 9 to the spare memory portion 19 even if a defect occurs in the reference cell 3. Thereby, it is possible to restrain lowering of the yield of nonvolatile memories (semiconductor memories). In this case, only the reference-cell replacement fuse 10-1 is a circuit to be added. That is, it is possible to restrain lowering of the yield of semiconductor memories due to a defective reference cell by minimizing the number of additional circuits.

As described above, the present invention includes a method for manufacturing a semiconductor memory, the method including: (a) fabricating the semiconductor memory which includes: a plurality of memory portions; and a plurality of spare memory portions, wherein each of the plurality of memory portions includes: a main cell array which includes a plurality of memory cells, each of the plurality of memory cells stores data in a nonvolatile state, a first reference cell which stores a first reference data in a nonvolatile state, and a first sense amplifier which reads a first state of the each of the plurality of memory cells, based on the first state and a second state of the first reference cell, each of the plurality of spare memory portions includes: a spare cell array which is provided as a spare of the main cell array, and includes a plurality of spare cells as spares of the plurality of memory cells, a second reference cell which stores a second reference data in a nonvolatile state, and a second sense amplifier which reads a third state of the each of the plurality of spare cells, based on the third state and a fourth state of the second reference cell; (b) examining the first reference cell of the each of the plurality of memory portions; (c) replacing one of the plurality of memory portions with one of the plurality of spare memory portions as a first spare memory portion, the one of the plurality of memory portions is a first defective memory portion which has a defect on the first reference cell.

In the method for manufacturing a semiconductor memory described above, wherein the semiconductor memory may further include: a control portion which includes a replacement portion, and outputs a switching signal based on a state of the replacement portion and an input of a signal which selects one of the plurality of memory portions in an operation, and a switching portion which selects an output of the one of the plurality of memory portions and the plurality of spare memory portions, the step (c) may include: (c1) setting the replacement portion such that the control portion outputs a first switching signal based on an input of a first signal which selects the defective memory portion, a first switching signal is the switching signal used by the switching portion to select an output of the first spare memory portion.

The method for manufacturing a semiconductor memory described above, may further include: (d) evaluating each of the plurality of memory cells, in the each of plurality of memory portions except the first defective memory portion; and (e) replacing a second defective memory portion with a second spare memory portion, wherein the second defective memory potion is another one of the plurality of memory portion having a defect on at least one of the plurality of memory cells, the second spare memory portion is another one of the plurality of spare memory portions.

It is apparent that the present invention is not limited to the above embodiment, that may be modified and changed without departing form the scope and spirit of the invention.

What is claimed is:

1. A semiconductor memory comprising:
a plurality of memory portions; and
a plurality of spare memory portions,
wherein each of said plurality of memory portions includes:
a main cell array which includes a plurality of memory cells, each of said plurality of memory cells stores data in a nonvolatile state,
a first reference cell which stores a first reference data in a nonvolatile state, and
a first sense amplifier which reads a first state of said each of the plurality of memory cells, based on said first state and a second state of said first reference cell,
each of said plurality of spare memory portions includes:
a spare cell array which is provided as a spare of said main cell array, and includes a plurality of spare cells as spares of said plurality of memory cells,
a second reference cell which stores a second reference data in a nonvolatile state, and a second sense amplifier which reads a third state of said each of the plurality of spare cells, based on said third state and a fourth state of said second reference cell,
one of said plurality of memory portions is replaced with one of said plurality of spare memory portions, if said one of said plurality of memory portions is a defective memory portion which has a defect on said first reference cell.

2. The semiconductor memory according to claim 1, further comprising:
a control portion which includes a replacement portion, and outputs a first switching signal based on a state of said replacement portion and an input of a first signal which selects said defective memory portion in an operation; and
a switching portion which selects an output of said one of the plurality of spare memory portions substituted for said defective memory portion, based on said first switching signal.

3. The semiconductor memory according to claim 2, wherein said replacement portion is set such that said control portion outputs said first switching signal based on said first signal in said operation.

4. A semiconductor memory comprising:
a plurality of memory portions;
a plurality of spare memory portions; and
a control portion,
wherein each of said plurality of memory portions includes:
a plurality of memory cells, and
a first reference cell,
each of said plurality of spare memory portions includes:
a plurality of spare memory cells, and
a second reference cell,
said control portion includes:
a first control portion, and
a second control portion,
said first control portion stores a replacement data regarding said plurality of memory portions and said plurality of spare memory portions;
said second control portion stores a replacement data regarding said first reference cell and said second reference cell.

5. The semiconductor memory according to claim 4, wherein said control portion replaces one of said plurality of memory portions with one of said plurality of spare memory portions, when one of at least one of said plurality of memory cells and said first reference cell is defective.

6. The semiconductor memory according to claim 4, wherein said each of the plurality of spare memory cells further includes a third reference cell,
said second control portion further replaces said second reference cell with said third reference cell, when one of at least one of said plurality of spare cells and said second reference cell is defective.

7. The semiconductor memory according to claim 4, wherein said plurality of memory cells and said plurality of spare cells are nonvolatile memories.

8. The semiconductor memory according to claim 4, wherein, said first reference cell and said second reference cell are nonvolatile memories.

9. A method of replacing a defective reference cell comprising;
detecting a defective reference cell in a cell array which has a sense amplifier and memory cells; and
in response to detecting the defective reference cell, replacing the cell array with a spare array which has a spare reference cell, a spare sense amplifier and spare memory cells.

* * * * *